United States Patent
Cho et al.

(10) Patent No.: US 10,418,335 B2
(45) Date of Patent: Sep. 17, 2019

(54) SUBSTRATE, METHOD OF SAWING SUBSTRATE, AND SEMICONDUCTOR DEVICE

(71) Applicant: Samsung Electronics Co., Ltd., Suwon-si, Gyeonggi-do (KR)

(72) Inventors: Yun-Rae Cho, Suwon-si (KR); Sundae Kim, Hwaseong-si (KR); Hyunggil Baek, Suwon-si (KR); Namgyu Baek, Suwon-si (KR); Seunghun Shin, Asan-si (KR); Donghoon Won, Asan-si (KR)

(73) Assignee: SAMSUNG ELECTRONICS CO., LTD. (KR)

( * ) Notice: Subject to any disclaimer, the term of this patent is extended or adjusted under 35 U.S.C. 154(b) by 0 days.

(21) Appl. No.: 15/850,336

(22) Filed: Dec. 21, 2017

(65) Prior Publication Data

US 2018/0261555 A1  Sep. 13, 2018

(30) Foreign Application Priority Data

Mar. 10, 2017 (KR) ........................ 10-2017-0030840

(51) Int. Cl.
| | |
|---|---|
| *H01L 23/00* | (2006.01) |
| *H01L 21/02* | (2006.01) |
| *H01L 21/78* | (2006.01) |
| *H01L 23/58* | (2006.01) |

(52) U.S. Cl.
CPC ...... *H01L 23/562* (2013.01); *H01L 21/02675* (2013.01); *H01L 21/78* (2013.01); *H01L 23/585* (2013.01)

(58) Field of Classification Search
CPC ............................................. H01L 21/78–784
See application file for complete search history.

(56) References Cited

U.S. PATENT DOCUMENTS

| | | | |
|---|---|---|---|
| 6,093,624 | A | 7/2000 | Letavic et al. |
| 7,679,133 | B2 | 3/2010 | Son et al. |
| 7,994,614 | B2 | 8/2011 | Tanaka et al. |
| 8,384,197 | B2 | 2/2013 | Nakamura |
| 8,553,466 | B2 | 10/2013 | Han et al. |
| 8,559,235 | B2 | 10/2013 | Yoon et al. |
| 8,563,427 | B2 | 10/2013 | Kim |

(Continued)

FOREIGN PATENT DOCUMENTS

| | | |
|---|---|---|
| JP | 2009044020 A | 2/2009 |
| JP | 2010074106 A | 4/2010 |
| JP | 2015220266 A | 12/2015 |

*Primary Examiner* — Mohammed R Alam
(74) *Attorney, Agent, or Firm* — Renaissance IP Law Group LLP

(57) ABSTRACT

A method of dividing a substrate includes preparing a substrate including a crystalline semiconductor layer having a scribe lane region and device regions, a dielectric layer on the crystalline semiconductor layer, and a partition structure in physical contact with the dielectric layer and provided on the scribe lane region of the crystalline semiconductor layer, forming an amorphous region in the crystalline semiconductor layer, and performing a grinding process on the crystalline semiconductor layer after the forming of the amorphous region. The amorphous region is formed in the scribe lane region of the crystalline semiconductor layer.

15 Claims, 17 Drawing Sheets

(56) References Cited

U.S. PATENT DOCUMENTS

| | | |
|---|---|---|
| 8,642,447 B2 | 2/2014 | Itou et al. |
| 8,654,587 B2 | 2/2014 | Yoon et al. |
| 8,759,948 B2 | 6/2014 | Sakamoto et al. |
| 2006/0163699 A1* | 7/2006 | Kumakawa ............. H01L 21/78 257/620 |
| 2009/0121271 A1 | 5/2009 | Son et al. |
| 2009/0243044 A1 | 10/2009 | Tanaka et al. |
| 2010/0072578 A1 | 3/2010 | Kunishima |
| 2011/0204488 A1 | 8/2011 | Itou et al. |
| 2011/0216603 A1 | 9/2011 | Han et al. |
| 2011/0233648 A1 | 9/2011 | Seol et al. |
| 2011/0241164 A1 | 10/2011 | Nakamura |
| 2011/0309509 A1 | 12/2011 | Kim |
| 2012/0051143 A1 | 3/2012 | Yoon et al. |
| 2013/0168831 A1 | 7/2013 | Sakamoto et al. |
| 2013/0279262 A1 | 10/2013 | Yoon et al. |
| 2015/0214077 A1* | 7/2015 | Tsai ........................ H01L 21/78 257/737 |
| 2018/0015569 A1* | 1/2018 | Lin .................... B23K 26/0057 |

* cited by examiner

SUBSTRATE, METHOD OF SAWING SUBSTRATE, AND SEMICONDUCTOR DEVICE

CROSS-REFERENCE TO RELATED APPLICATION

This U.S. non-provisional patent application claims priority under 35 U.S.C. § 119 to Korean Patent Application No. 10-2017-0030840, filed on Mar. 10, 2017, in the Korean Intellectual Property Office, the disclosure of which is hereby incorporated by reference in its entirety.

TECHNICAL FIELD

This disclosure generally relates to a substrate, a method of dividing the substrate, and a semiconductor device.

BACKGROUND

Light, small, high-speed, high-performance and low-cost electronic products may be provided with the development of an electronic industry. A wafer-level substrate may be used in manufacture of a semiconductor device. The substrate may include a plurality of device regions, and the substrate may be sawed to separate semiconductor devices from each other. The semiconductor devices should be prevented from becoming damaged in the process of sawing the substrate. In addition, when the sawing of the substrate is poor, a manufacture yield of the semiconductor devices may be reduced.

SUMMARY

Embodiments of the inventive concepts may provide a substrate capable of separating semiconductor devices well, a method of sawing the substrate, and a semiconductor device.

In one embodiment, a method of dividing a substrate may include preparing a substrate by providing a crystalline semiconductor layer having a scribe lane region and device regions, forming a dielectric layer on the crystalline semiconductor layer, and forming a partition structure in physical contact with the dielectric layer. The partition structure may be provided on the scribe lane region of the crystalline semiconductor layer. An amorphous region may be formed in the crystalline semiconductor layer and a grinding process may be performed on the crystalline semiconductor layer after the amorphous region is formed. The amorphous region may be formed in the scribe lane region of the crystalline semiconductor layer.

In another embodiment, a semiconductor device may include a crystalline semiconductor substrate, a dielectric layer on the crystalline semiconductor substrate, a partition structure provided in the dielectric layer and having a different strength from the dielectric layer, and a protective layer provided on the dielectric layer. The dielectric layer may expose at least a portion of a sidewall of the partition structure.

In another embodiment, a substrate may include a semiconductor layer including device regions and a scribe lane region, a dielectric layer on the semiconductor layer, a protective layer on the dielectric layer, and a partition structure provided in the dielectric layer and being in physical contact with the protective layer. The partition structure may have a different strength from the dielectric layer. The scribe lane region of the semiconductor layer may include a first region overlapped by the partition structure, when viewed in a plan view, and having a width of 5 μm to 20 μm, and second regions spaced apart from the partition structure, when viewed in the plan view. The second regions may be disposed between the first region and respective ones of the device regions.

BRIEF DESCRIPTION OF THE DRAWINGS

Embodiments of the inventive concepts will become more apparent in view of the attached drawings and accompanying detailed description.

DETAILED DESCRIPTION OF EXAMPLE EMBODIMENTS

Substrates, methods of dividing or singulating (e.g., sawing) the same, and semiconductor devices according to embodiments of the inventive concepts will be described hereinafter.

Figure 1A:
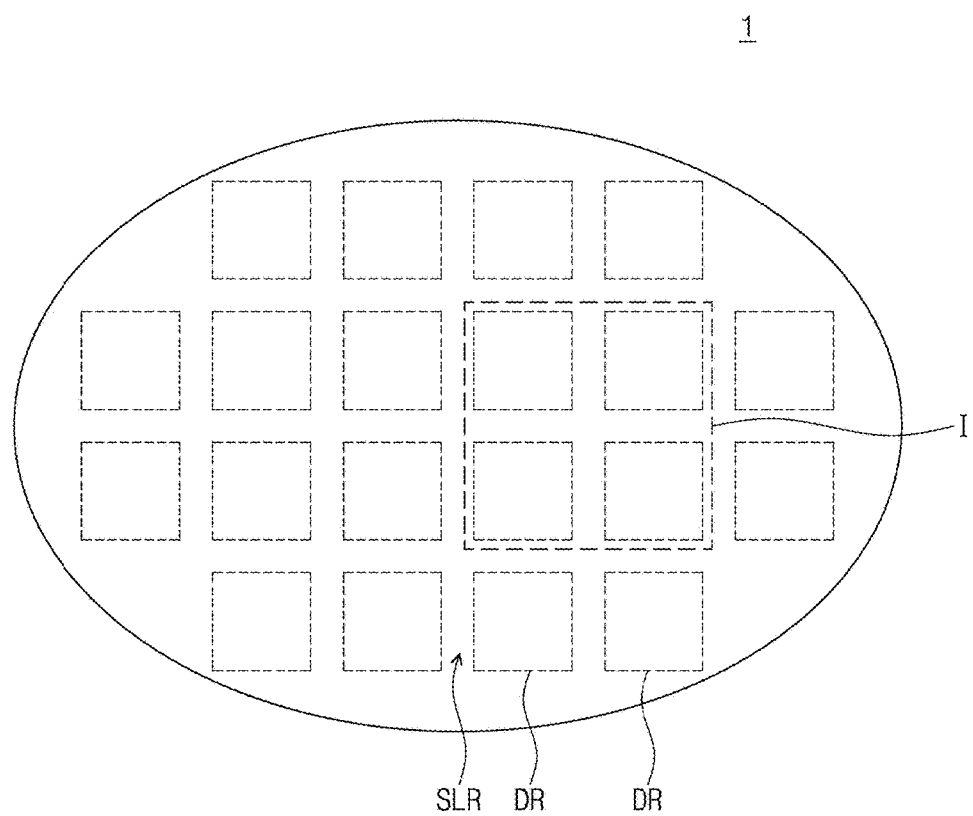
FIG. 1A is a plan view illustrating a substrate according to some embodiments of the inventive concepts.
Figure 1B:
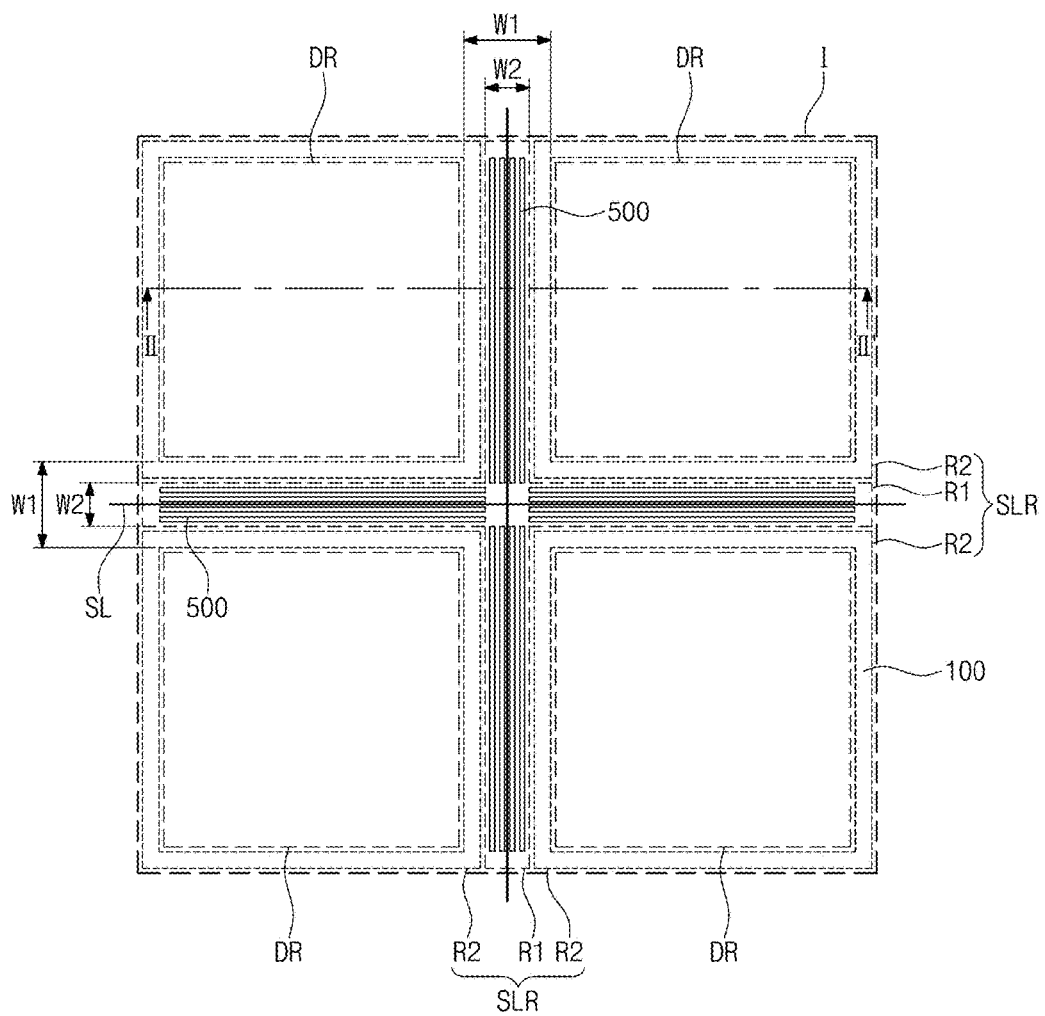
FIG. 1B is an enlarged view of region 'I' shown in FIG. 1A.
Figure 2A:
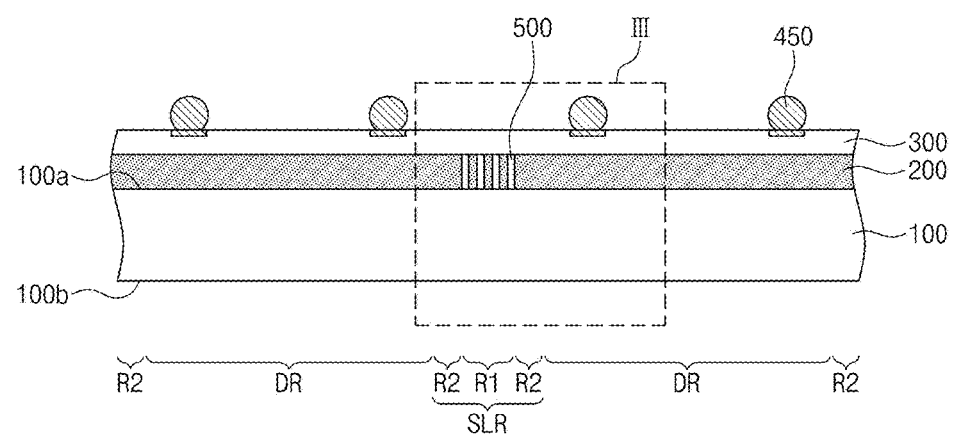
FIG. 2A is a cross-sectional view taken along line II-II' shown in FIG. 1B.
Figure 2B:
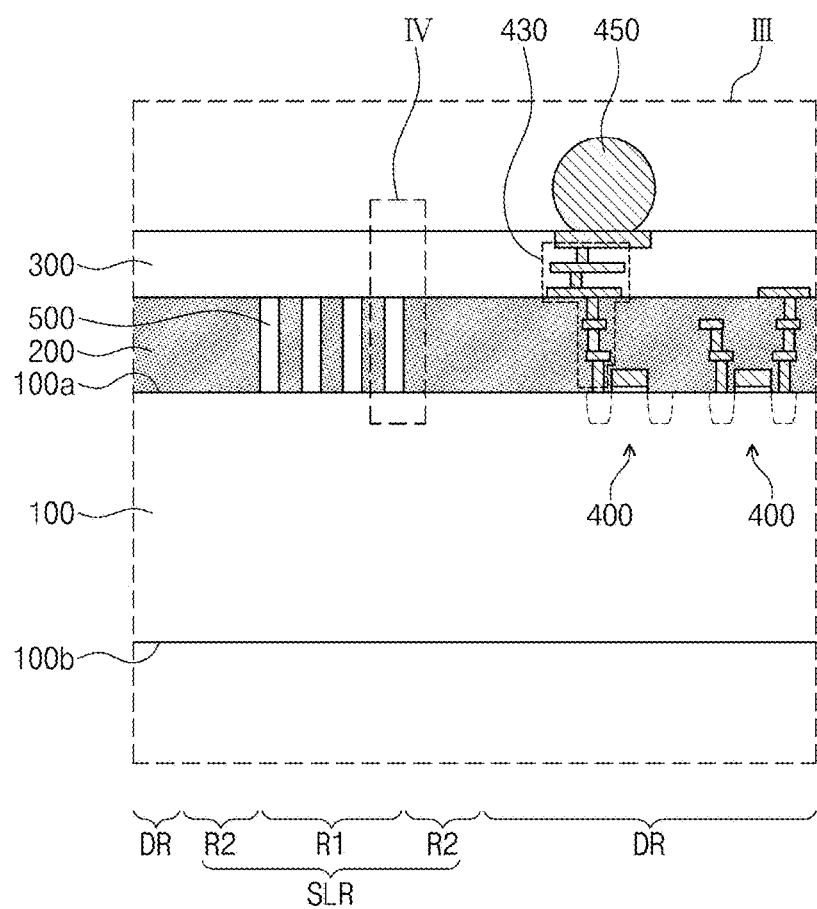
FIG. 2B is an enlarged view of region 'III' shown in FIG. 2A.

FIG. 1A is a plan view illustrating a substrate according to some embodiments of the inventive concepts. FIG. 1B is an enlarged view of region T shown in FIG. 1A. FIG. 2A is a cross-sectional view taken along line II-II' shown in FIG. 1B. FIG. 2B is an enlarged view of region 'III' shown in FIG. 2A.

Referring to FIGS. 1A, 1B, 2A, and 2B, a substrate 1 may be provided as a wafer-level substrate. The substrate 1 may include a semiconductor layer 100, a dielectric layer 200, a protective layer 300, and partition structures 500. The semiconductor layer 100 may include device regions DR and a scribe lane region SLR, as exemplarily illustrated in FIG. 1A. Each of the device regions DR of the semiconductor layer 100 may be surrounded by the scribe lane region SLR, when viewed in a plan view. Thus, the device regions DR of the semiconductor layer 100 may be spaced apart from each other by the scribe lane region SLR. The semiconductor layer 100 may have a first surface 100a and a second surface 100b opposite to the first surface 100a. The semiconductor layer 100 may include a crystalline semiconductor layer. The semiconductor layer 100 may be a crystalline semiconductor substrate. In some embodiments, the semiconductor layer 100 may be a single-crystalline semiconductor layer. As illustrated in FIG. 2B, integrated circuits 400 may be disposed on the device regions DR of the semiconductor layer 100. The integrated circuits 400 may include a logic circuit, a memory circuit, or a combination thereof.

The dielectric layer 200 may be disposed on the first surface 100a of the semiconductor layer 100. The dielectric layer 200 may include an insulating material. The dielectric layer 200 may include a low-k dielectric material. The dielectric layer 200 may have a dielectric constant lower than that of silicon oxide ($SiO_2$). For example, the dielectric layer 200 may have a dielectric constant lower than 3.9. In particular, the dielectric layer 200 may have a dielectric constant of 1.0 (or about 1.0) to 3.0 (or about 3.0). For example, the dielectric layer 200 may include at least one of an oxide-based material doped with impurities, porous silicon oxide, or an organic polymer. The oxide-based material doped with impurities may, for example, include fluorine-doped oxide (or fluorosilicate glass (FSG)), a carbon-doped oxide, silicon oxide, hydrogen silsesquioxane (SiO:H; HSQ), methyl silsesquioxane ($SiO:CH_3$; MSQ), or a-SiOC (SiOC:H). The organic polymer may include a polyallylether-based resin, a cyclic fluorine resin, a siloxane copolymer, a polyallylether fluoride-based resin, a polypentafluorostylene-based resin, a polytetrafluorostylene-based resin, a polyimide fluoride resin, polynaphthalene fluoride, a polycide resin, or the like or any combination thereof.

The protective layer 300 may be disposed on the dielectric layer 200. The protective layer 300 may include a material of which a strength is different from that of the dielectric layer 200. In some embodiments, the strength of protective layer 300 and the strength of the dielectric layer 200 may include shear strengths. For example, the strength of the protective layer 300 may be greater than the strength of the dielectric layer 200. Even though not shown in the drawings, the protective layer 300 may include a plurality of stacked layers. The protective layer 300 may include an insulating material. For example, the protective layer 300 may include at least one of tetraethyl orthosilicate (TEOS), silicon nitride, a high-density plasma (HDP) oxide, or the like. In certain embodiments, the protection layer 300 may include at least one of a polymer or a resin.

Connection terminals 450 may be provided on the protective layer 300. The connection terminals 450 may be provided on the device regions DR of the semiconductor layer 100. The connection terminals 450 may include a conductive material. The connection terminals 450 may have solder ball shapes, bump shapes, pillar shapes, or the like or any combinations thereof. As illustrated in FIG. 2B, each of the connection terminals 450 may be electrically connected to at least one of the integrated circuits 400 through an interconnection structure 430. The interconnection structure 430 may be provided in the dielectric layer 200 and the protective layer 300.

The partition structures 500 may be disposed in the dielectric layer 200. The partition structures 500 may be in physical contact with the semiconductor layer 100 and the protective layer 300. Even though not shown in the drawings, the arrangement of the partition structures 500 may be variously modified. For example, in some embodiments, the partition structures 500 may be spaced apart from the semiconductor layer 100, the protective layer 300 or both the semiconductor layer 100 and the protective layer 300. In certain embodiments, the partition structures 500 may further extend into the protective layer 300, into the semiconductor layer 100, or into both the semiconductor layer 100 and the protective layer 300. A strength of the partition structures 500 may be different from that of the dielectric layer 200. In some embodiments, the strength of the partition structures 500 and the strength of the dielectric layer 200 may include shear strengths. For example, the strength of the partition structures 500 may be greater or less than the strength of the dielectric layer 200. The partition structures 500 may include a different material from the dielectric layer 200. In some embodiments, the partition structures 500 may include a metal such as copper, aluminum, tungsten, titanium, tantalum, or the like or any combination thereof. In certain embodiments, the partition structures 500 may include an insulating material such as tetraethyl orthosilicate (TEOS), silicon nitride, a high-density plasma (HDP) oxide, a polymer, a resin, or the like or any combination thereof. As illustrated in FIG. 1B, the partition structures 500 may be provided on the scribe lane region SLR of the semiconductor layer 100. The partition structures 500 may be spaced apart from the device regions DR of the semiconductor layer 100 and, when viewed in plan view, may surround each of the device regions DR. At least two partition structures 500 may be disposed between adjacent two device regions DR of the semiconductor layer 100, when viewed in a plan view. Further, distances between adjacent ones of the partition structures 500 disposed between two adjacent device regions DR of the semiconductor layer 100 may be substantially equal to each other. The partition structures 500 may have bar shapes when viewed in a plan view, but may have any other suitable or desired shape.

The scribe lane region SLR of the semiconductor layer 100 may include a first region R1 and multiple second regions R2. The partition structures 500 may be disposed on the first region R1 of the scribe lane region SLR, but may not be disposed on the second regions R2 of the scribe lane region SLR. A separation line (or saw line) SL (not shown in the FIGS.) may be provided on the first region R1 of the scribe lane region SLR. Here, the separation line SL may be an imaginary line. For example, the separation line SL may be provided between two adjacent partition structures 500. The partition structures 500 may have long axes extending in a direction parallel to the separation line SL adjacent thereto. The scribe lane region SLR of the semiconductor layer 100 may have a width W1 of 60 nm (or about 60 nm) to 80 nm (or about 80 nm). The first region R1 of the scribe lane region SLR of the semiconductor layer 100 may have a width W2 of 5 nm (or about 5 μm) to 20 nm (or about 20 nm). The second regions R2 of the scribe lane region SLR of the semiconductor layer 100 may be disposed between the first region R1 of the scribe lane region SLR and respective device regions DR of the semiconductor layer 100.

Figure 3A:
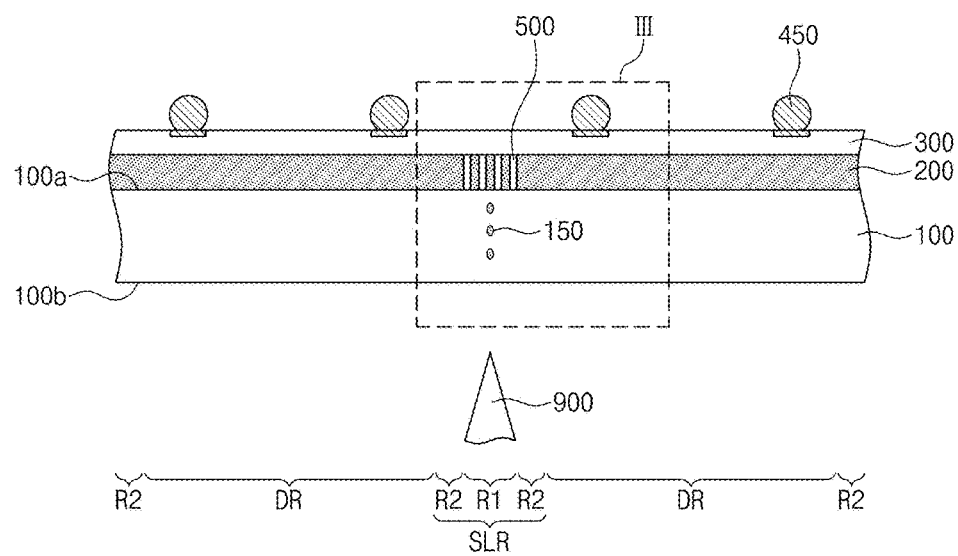
FIGS. 3A, 4A, and 5A are cross-sectional views illustrating a method of dividing a substrate, according to some embodiments of the inventive concepts.
Figure 3B:
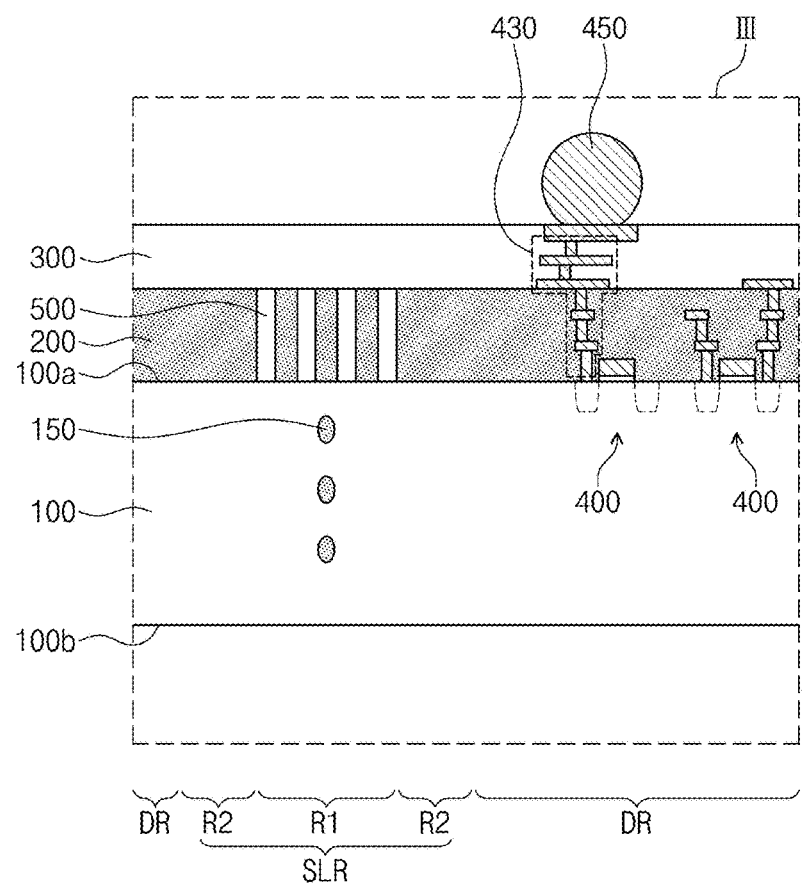
FIGS. 3B, 4B, and 5B are enlarged views of regions 'III' shown in FIGS. 3A, 4A, and 5A, respectively.
Figure 4A:
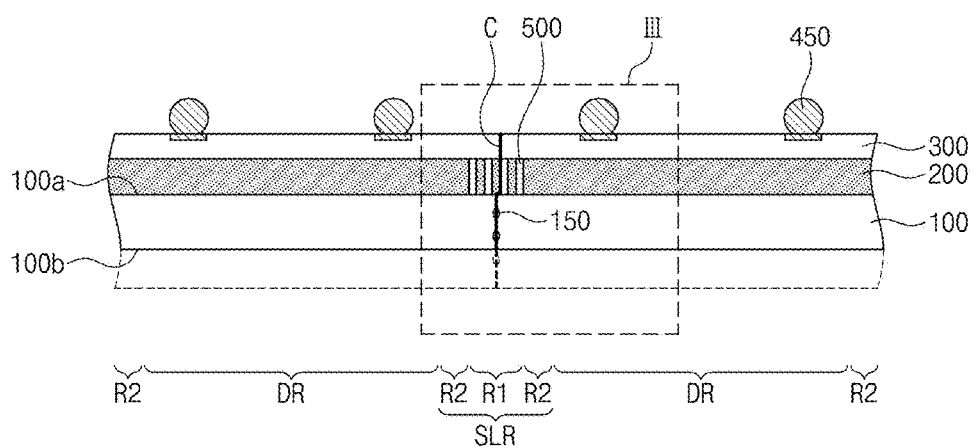
Figure 4B:
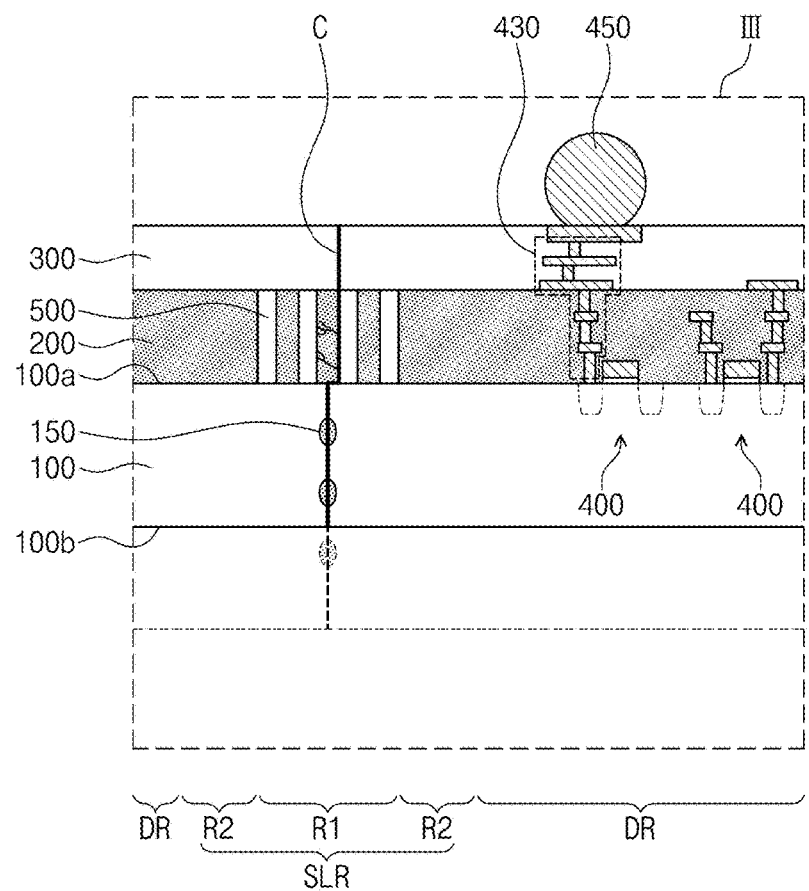
Figure 5A:
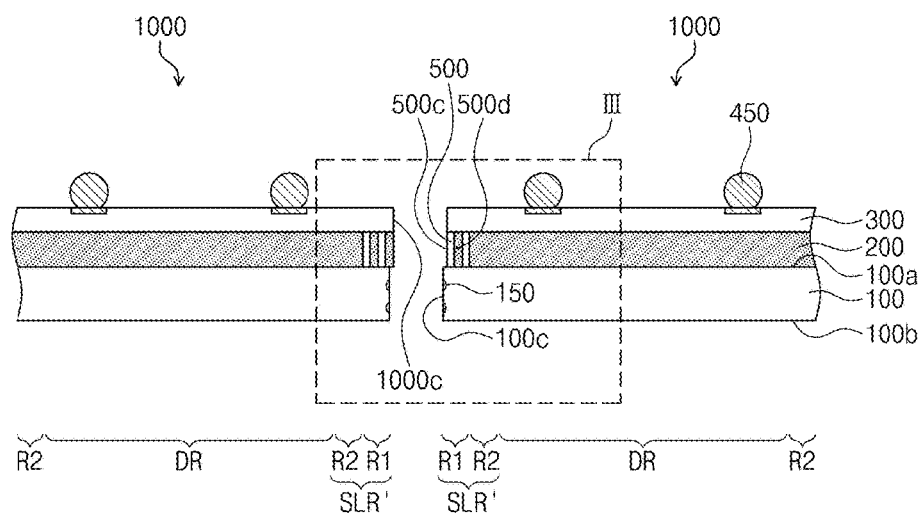
Figure 5B:
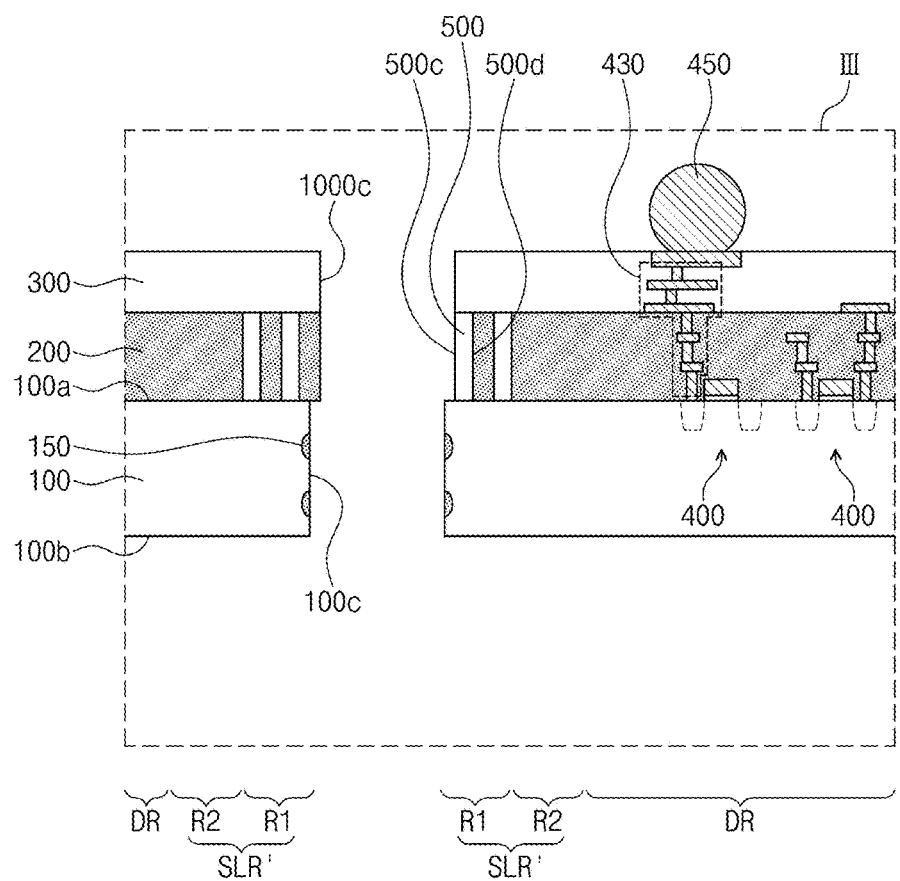

FIGS. 3A, 4A, and 5A are cross-sectional views taken along line II-II' of FIG. 1B to illustrate a method of dividing a substrate, according to some embodiments of the inventive concepts. FIGS. 3B, 4B, and 5B are enlarged views of regions 'III' of FIGS. 3A, 4A, and 5A, respectively. Hereinafter, the same technical features as described above will not be mentioned, or will be mentioned only briefly, for the purpose of ease and convenience in explanation.

Referring to FIGS. 1A, 1B, 3A, and 3B, a substrate 1 may be prepared. The substrate 1 may be substantially the same as described with reference to FIGS. 1A, 1B, 2A, and 2B. The semiconductor layer 100 of the substrate 1 may include a crystalline semiconductor material. A laser apparatus 900 may be disposed on the second surface 100b of the semiconductor layer 100. A laser may be irradiated from the laser apparatus 900 to the semiconductor layer 100 to locally heat the semiconductor layer 100. A crystal structure of the heated region of the semiconductor layer 100 may be changed. Thus, amorphous regions 150 may be formed in the semiconductor layer 100. The laser may be irradiated along the separation line SL (see FIG. 1B) of the semiconductor layer 100 and, when viewed in plan view, the amorphous regions 150 may thus overlap with the separation line SL. The amorphous regions 150 may be formed in the first region R1 of the scribe lane region SLR of the semiconductor layer 100. The amorphous regions 150 may be provided between the partition structures 500, when viewed in a plan view. Alternatively, the amorphous regions 150 may be overlapped by the partition structures 500, when viewed in a plan view. The amorphous regions 150 may be formed at different depths in the semiconductor layer 100. For example, the amorphous regions 150 may be provided at different distances from the second surface 100b of the semiconductor layer 100.

Referring to FIGS. 1A, 1B, 4A, and 4B, a grinding process may be performed on the second surface 100b of the semiconductor layer 100 to remove a portion of the semiconductor layer 100, as shown by a dotted line in FIG. 4A. In other words, the substrate 1 may be thinned by the grinding process. The grinding process of the semiconductor layer 100 may include a back-lap process, a chemical mechanical polishing (CMP) process, or the like or any combination thereof. The amorphous regions 150 of the semiconductor layer 100 may act as crack seeds during the grinding process of the semiconductor layer 100. For example, a crack C may be formed from the amorphous regions 150 of the semiconductor layer 100, and may propagate from the second surface 100b to the first surface 100a of the semiconductor layer 100. The crack C may propagate along a crystal plane of the semiconductor layer 100. The dielectric layer 200 may have different characteristics from the semiconductor layer 100. For example, the dielectric layer 200 may not have a crystal structure. The partition structures 500 may function as mediums for assisting the propagation of the crack C. For example, the crack C may easily propagate into the dielectric layer 200 due to the difference in strength between the dielectric layer 200 and the partition structures 500. The dielectric layer 200 may have different characteristics from the protective layer 300. For example, the strength of the protective layer 300 may be greater than that of the dielectric layer 200. The partition structures 500 may be in physical contact with the protective layer 300. In this case, the crack C may easily propagate into the protective layer 300 by the partition structures 500. As illustrated in FIG. 4B, the partition structures 500 may prevent the crack C from propagating into portions of the dielectric layer 200 which, when viewed in plan view, overlap with the device regions DR of the semiconductor layer 100. Thus, it is possible to prevent the integrated circuits 400 and the interconnection structure 430 of the device regions DR from being damaged during a grinding process. The crack C may propagate from the semiconductor layer 100 into the dielectric layer 200 and the protective layer 300 to divide the substrate 1. According to some embodiments of the inventive concepts, the process of dividing the substrate 1 may include the process of forming the amorphous regions 150 and the process of grinding the semiconductor layer 100. A mechanical apparatus such as a blade may not used in the process of dividing the substrate 1. According to some embodiments, a kerf width of the substrate 1 may be reduced. Thus, the first region R1 of the scribe lane region SLR of the semiconductor layer 100 may have the width W2 of 5 nm (or about 5 μm) to 20 nm (or about 20 nm). As a result, the number of the device regions DR in the semiconductor layer 100 of the substrate 1 may be increased.

If the crack C propagates along an interface between the dielectric layer 200 and the protective layer 300, it may be difficult to divide the substrate 1. However, according to some embodiments, the partition structures 500 may prevent and/or inhibit the crack C from propagating into the dielectric layer 200 overlapping with the device regions DR. Thus, the substrate 1 may be easily divided.

Referring to FIGS. 1A, 1B, 5A, and 5B, the device regions DR of the semiconductor layer 100 may be separated from each other along the separation line SL upon separating the substrate 1. As a result, semiconductor devices 1000 may be separated from each other. A tensile force may further be applied to the substrate 1 in the process of separating the semiconductor devices 1000 from each other. Each of the semiconductor devices 1000 may include a device region DR of the semiconductor layer 100, a portion of the dielectric layer 200, and a portion of the protective layer 300. Here, the portion of the dielectric layer 200 and the portion of the protective layer 300 may correspond to a respective device region DR. In addition, each of the semiconductor devices 1000 may further include a scribe lane region SLR', and the dielectric layer 200 and the protective layer 300 disposed on the scribe lane region SLR'. Here, the scribe lane region SLR' may include a portion of the first region R1 of the scribe lane region SLR of the semiconductor layer 100 and the second region R2 of the scribe lane region SLR. Each of the semiconductor devices 1000 may include the partition structures 500. The partition structures 500 may be adjacent to sidewalls 1000c of the semiconductor devices 1000. In some embodiments, some of the partition structures 500 may be exposed at the sidewalls 1000c of the semiconductor devices 1000. Here, the sidewalls 1000c of the semiconductor devices 1000 may be cut surfaces. The dielectric layer 200 may expose at least a portion of one of the partition structures 500 of a semiconductor device 1000. The dielectric layer 200 may cover a first sidewall 500d of the exposed partition structure 500 but may expose a second sidewall 500c of the exposed partition structure 500. The first and second sidewalls 500d and 500c of the exposed partition structure 500 may be opposite to each other. The partition structures 500 may surround the dielectric layer 200 of a semiconductor device 1000, when viewed in plan view.

The amorphous regions 150 may remain in the semiconductor layer 100 of the semiconductor device 1000. The amorphous regions 150 may be exposed at a sidewall 100c of the semiconductor layer 100. Alternatively, the amorphous regions 150 may be removed during the grinding process of the semiconductor layer 100. Since the substrate 1 is divided by the propagation of the crack C, the sidewalls 100c of the semiconductor layer 100 and sidewalls of the protective layer 300 may be smooth. A semiconductor device 1000 may include one or more memory devices such as dynamic random access memory (DRAM) devices, NAND flash memory devices, NOR flash memory devices, one-NAND memory devices, phase change random access memory (PRAM) devices, resistance random access memory (ReRAM) devices, magnetic random access memory (MRAM) devices, or the like or any combination thereof. In certain embodiments, a semiconductor device 1000 may include one or more logic devices such as digital signal processors or controllers.

Partition structures according to some embodiments of the inventive concepts will be described hereinafter. The descriptions to the same technical features as in the above embodiments will be omitted, or mentioned only briefly, for the purpose of ease and convenience in explanation. In descriptions to embodiments of FIGS. 6, 7A, 7B, 7C, and 8, a single partition structure will be described for the purpose of ease and convenience in explanation.

Figure 6:
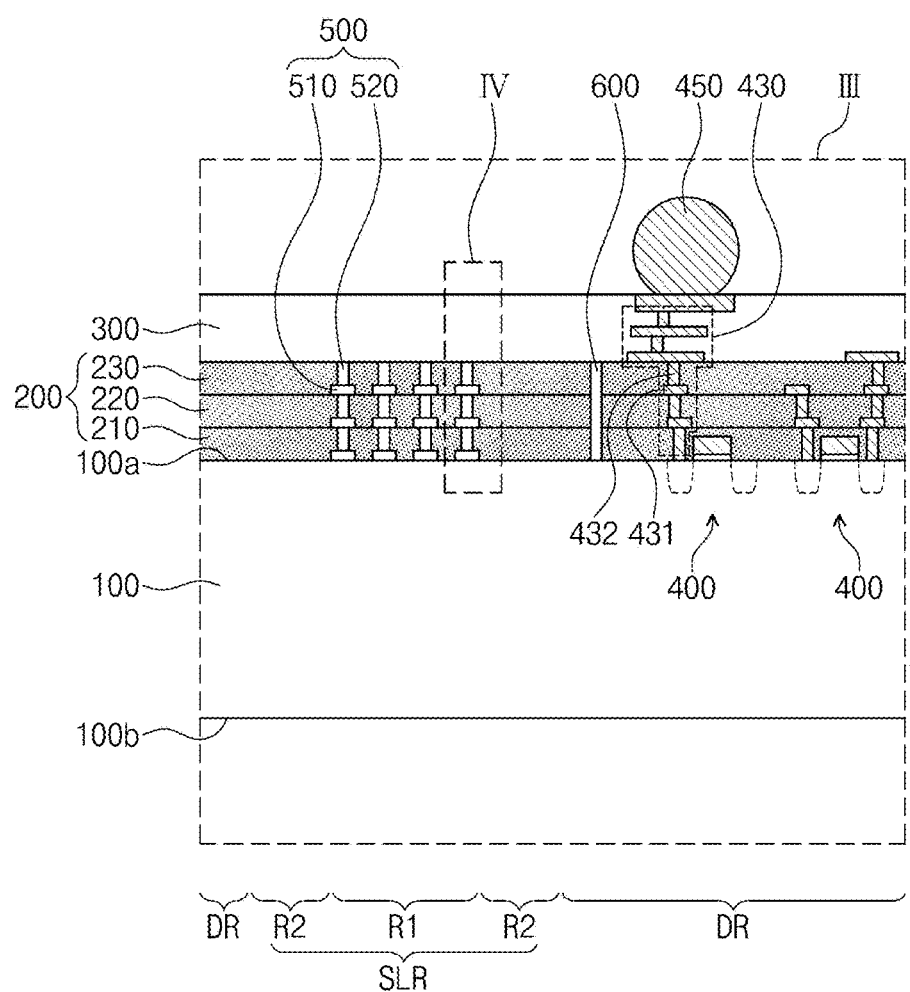
FIG. 6 is an enlarged view corresponding to region 'III' shown in FIG. 2A, and illustrates a partition structure according to some embodiments of the inventive concepts.

FIG. 6 is an enlarged view corresponding to region 'III' shown in FIG. 2A, and illustrates a partition structure according to some embodiments of the inventive concepts.

Referring to FIG. 6, a dielectric layer 200 may include a first dielectric layer 210, a second dielectric layer 220, and a third dielectric layer 230. However, the dielectric layer 200 may include more or fewer dielectric layers than illustrated in FIG. 6. The partition structure 500 may penetrate the dielectric layer 200 and may be in physical contact with the semiconductor layer 100 and the protective layer 300. The partition structure 500 may include a plurality of partition patterns 510 and a plurality of partition vias 520. The partition patterns 510 may be provided within the first, second and third dielectric layers 210, 220, and 230, respectively. The partition vias 520 may penetrate at least one of the first dielectric layer 210, the second dielectric layer 220, or the third dielectric layer 230. The partition vias 520 may be in physical contact with respective ones of the partition patterns 510.

The partition structure 500 may have a strength greater than that of the dielectric layer 200. The partition patterns 510 and the partition vias 520 may include a conductive material, e.g., a metal. The partition patterns 510 and the partition vias 520 may be electrically insulated from the integrated circuits 400. The interconnection structure 430 may include a plurality of conductive patterns 431 and a plurality of conductive vias 432. The conductive patterns 431 may be provided within the first, second and third dielectric layers 210, 220, and 230, respectively. The conductive vias 432 may penetrate at least one of the first dielectric layer 210, the second dielectric layer 220, or the third dielectric layer 230. The partition vias 520 and the conductive vias 432 may be formed by a common process. Formation of the partition vias 520 and the conductive vias 432 may include forming trenches in the third dielectric layer 230 and filling the conductive material in the trenches. The trenches may expose the partition patterns 510 and the conductive patterns 431, respectively. The partition patterns 510 and the conductive patterns 431 may be formed by a common process. For example, a conductive layer may be formed on the second dielectric layer 220, and pattering process may be performed on the conductive layer to form the partition patterns 510 and the conductive patterns 431. The pattering process may include etching process. However, embodiments of the inventive concepts are not limited thereto. For example, the partition vias 520 may be formed in a process that is different from that in which the conductive vias 432 are formed. Likewise, in other embodiments, the partition patterns 510 may be formed in a process that is different from that in which the conductive patterns 431 are formed.

A protective ring 600 may be provided in the dielectric layer 200. The protective ring 600 may surround each of the device regions DR of the semiconductor layer 100, when viewed in a plan view. The protective ring 600 may include a metal, an insulating material, a doped semiconductor material, or the like or any combination thereof. When the semiconductor devices 1000 are separated from each other as described with reference to FIGS. 5A and 5B, the protective ring 600 may protect each of the semiconductor devices 1000 from external contamination.

Unlike the processes described above used to form the partition patterns 510 and partition vias 520, the partition pattern 510 and the partition via 520 may be formed by a damascene process. Thus, the shape and arrangement of the partition structure 500 shown in FIG. 6 may be variously modified, depending upon how the partition structure 500 is formed. Modified examples of the shape and arrangement of the partition structure 500 will be described hereinafter.

Figure 7A:
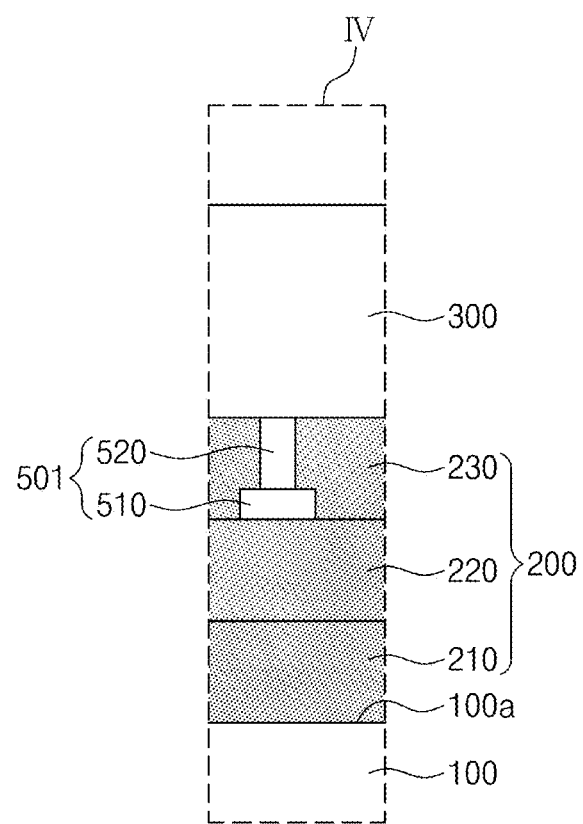
FIGS. 7A to 7C are enlarged views corresponding to region 'IV' shown in FIG. 6, and illustrate partition structures according to some embodiments of the inventive concepts.
Figure 7B:
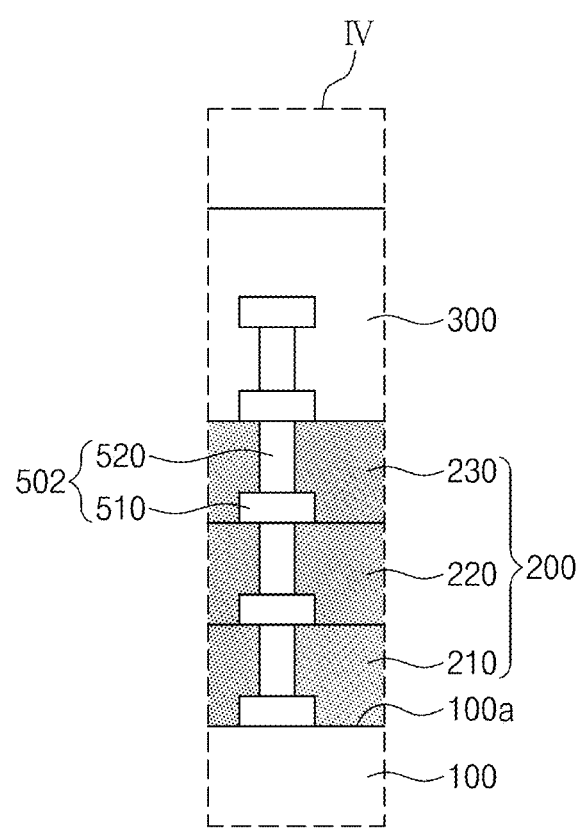
Figure 7C:
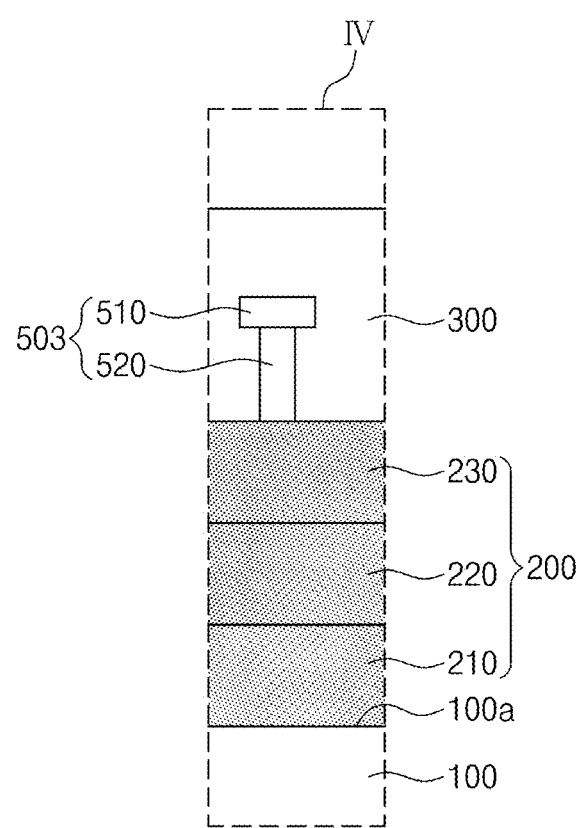

FIGS. 7A to 7C are enlarged views corresponding to region 'IV' shown in FIG. 6, and illustrate partition structures according to some embodiments of the inventive concepts. The descriptions to the same technical features as in the above embodiments will be omitted, or mentioned only briefly, for the purpose of ease and convenience in explanation.

As illustrated in FIG. 7A, the partition structure 500 may be provided as partition structure 501, and may penetrate a portion of the dielectric layer 200. For example, the partition structure 501 may be provided in the third dielectric layer 230 but may not be provided in the first dielectric layer 210 or the second dielectric layer 220. Although the partition structure 501 is illustrated as not extending into the second dielectric layer 220, the partition structure 501 may, in another embodiment, extend partially or completely into the second dielectric layer 220, but not into the first dielectric layer 210.

As illustrated in FIG. 7B, the partition structure 500 may be provided as partition structure 502, and may extend into the protective layer 300. For example, the partition structure 502 may protrude from the dielectric layer 200 into the protective layer 300. The partition structure 502 may be in contact with the semiconductor layer 100. Although the partition structure 502 is illustrated as physically contacting the semiconductor layer 100, the partition structure 502 may, in another embodiment, be spaced apart from the semiconductor layer 100.

As illustrated in FIG. 7C, the partition structure 500 may be provided as partition structure 503, and may be provided only in the protective layer 300. Thus, the partition structure 503 may be disposed on the third dielectric layer 230 and not extend into the third dielectric layer 230.

Figure 8:
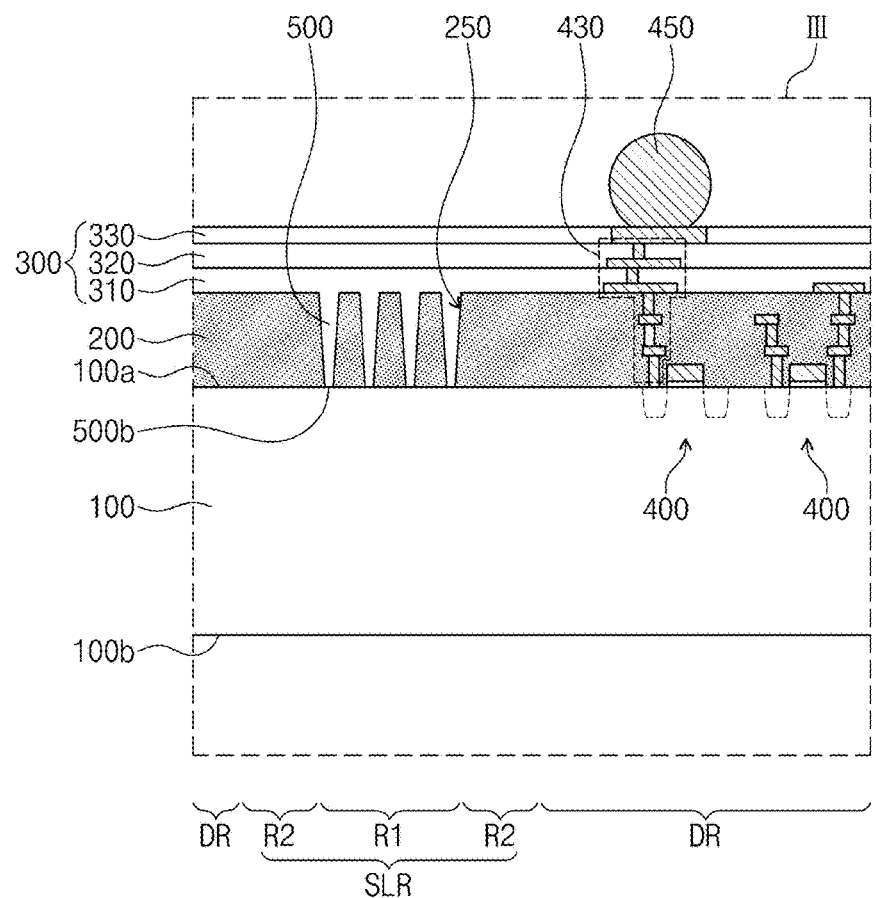
FIG. 8 is an enlarged view corresponding to region 'III' shown in FIG. 2A, and illustrates a partition structure according to some embodiments of the inventive concepts.

FIG. 8 is an enlarged view corresponding to region 'III' shown in FIG. 2A, and illustrates a partition structure according to some embodiments of the inventive concepts. Hereinafter, a single partition structure will be described for the purpose of ease and convenience in explanation.

Figure 9:
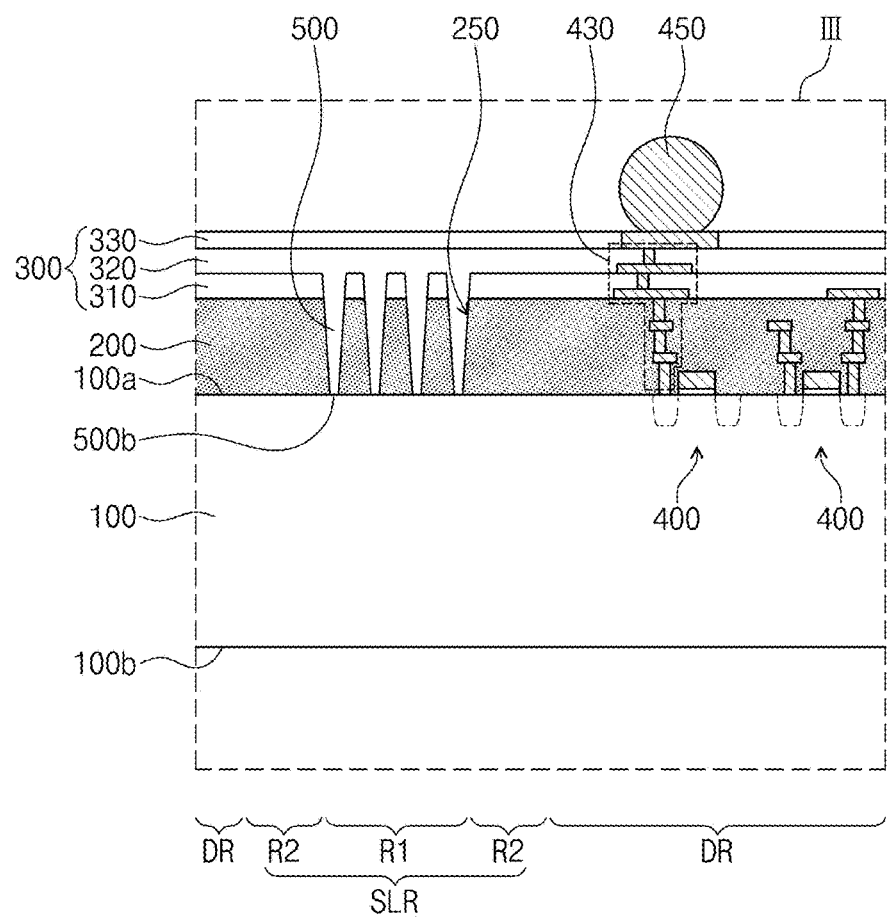
FIG. 9 is an enlarged view corresponding to region 'III' shown in FIG. 2A, and illustrates a partition structure according to some embodiments of the inventive concepts.
Figure 10:
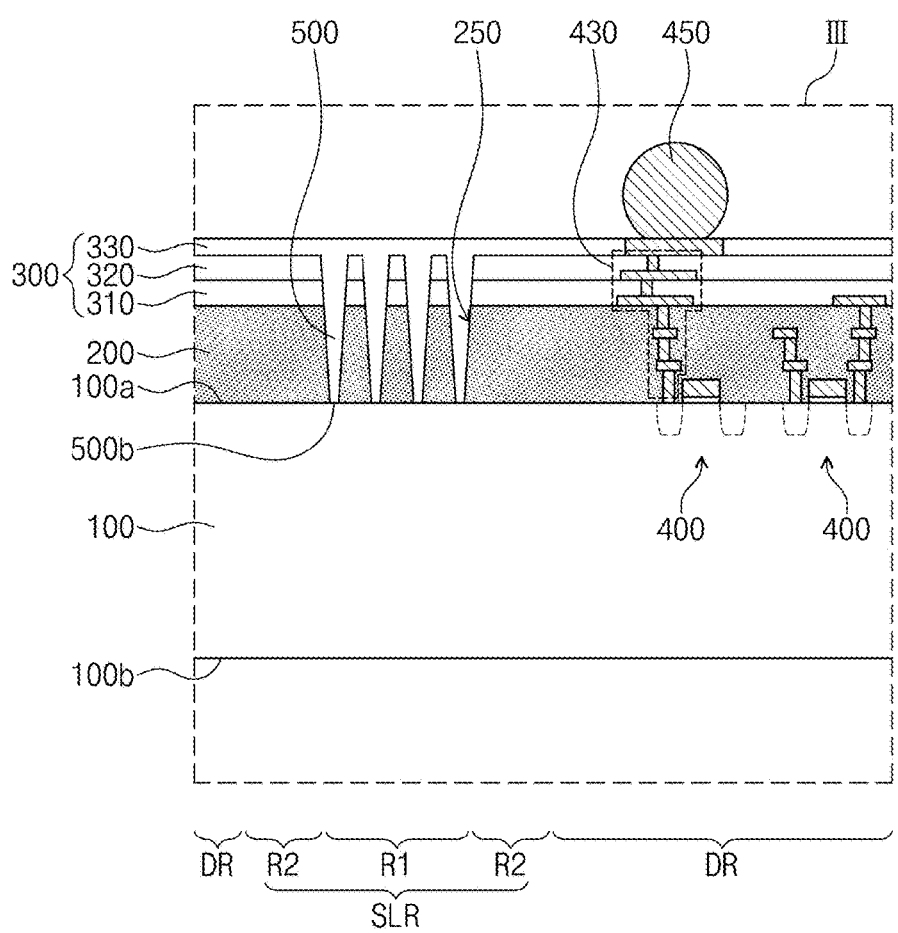
FIG. 10 is an enlarged view corresponding to region 'III' shown in FIG. 2A, and illustrates a partition structure according to some embodiments of the inventive concepts.

Referring to FIGS. 8, 9, and 10, a trench 250 may be provided in the dielectric layer 200. The trench 250 may extend from a top surface of the dielectric layer 200 toward a bottom surface of the dielectric layer 200. A partition structure 500 may fill the trench 250. The partition structure 500 may include a different material from the dielectric layer 200. A protective layer 300 may include a first protective layer 310, a second protective layer 320, and a third protective layer 330, which are sequentially stacked. However, the protective layer 300 may include more or fewer protective layers than illustrated in FIGS. 8, 9, and 10. As illustrated in FIG. 8, the partition structure 500 and the first protective layer 310 may constitute a single unit body. In other words, the partition structure 500 may be connected to the first protective layer 310 without an interface interposed therebetween and may include the same material as the first protective layer 310. For example, the partition structure 500 may include a material such as tetraethyl orthosilicate (TEOS), a high-density plasma (HDP) oxide, or the like or any combination thereof. In one embodiment, the partition structure 500 and the first protective layer 310 may be formed by a common process. Although FIG. 8 illustrates an embodiment in which the partition structure 500 and the first protective layer 310 constitute a single unit body, it will be appreciated that, in other embodiments, as illustrated in FIG. 9, the partition structure 500 and the second protective layer 320 may constitute a single unit body or as illustrated in FIG. 10, the partition structure 500 and the third protective layer 330 may constitute a single unit body. In certain embodiments, the partition structure 500 may include a different material from the first to third protective layers 310, 320, and 330.

The partition structure 500 may penetrate the dielectric layer 200 and may be in contact with the semiconductor layer 100. In the illustrated embodiment, the partition structure 500 may extend into the semiconductor layer 100. In this case, a bottom surface 500b of the partition structure 500 may be provided in the semiconductor layer 100. In another embodiment, however, the bottom surface 500b of the partition structure 500 may be disposed in the dielectric layer 200 and may be spaced apart from the semiconductor layer 100.

According to some embodiments of the inventive concepts, the partition structures may be disposed in the dielectric layer. The substrate may be easily divided due to the presence of the partition structures. In the process of dividing the substrate, the partition structures may prevent damage of the integrated circuits and the interconnection structures disposed on the device regions of the semiconductor layer.

While the inventive concepts have been described above with reference to example embodiments, it will be apparent to those skilled in the art that various changes and modifications may be made without departing from the spirits and scopes of the inventive concepts. Therefore, it should be understood that the above embodiments are not limiting, but illustrative. Thus, the scopes of the inventive concepts are to be determined by the broadest permissible interpretation of the following claims and their equivalents, and shall not be restricted or limited by the foregoing description.

What is claimed is:

1. A method of dividing a substrate, the method comprising:
    preparing a substrate by: providing a crystalline semiconductor layer having a scribe lane region and device regions, the device regions separated from one another along a width direction of the scribe lane region; forming a dielectric layer on the crystalline semiconductor layer; and forming a partition structure in physical contact with the dielectric layer, the partition structure provided on the scribe lane region of the crystalline semiconductor layer; and providing a protective layer on the dielectric layer, the protective layer formed of a different material from that of the dielectric layer;
    forming an amorphous region in the crystalline semiconductor layer; and
    performing a grinding process on the crystalline semiconductor layer after forming the amorphous region,
    wherein the amorphous region is formed in the scribe lane region of the crystalline semiconductor layer, and
    wherein the protective layer overlaps an uppermost surface of the partition structure along the width direction of the scribe lane region and extending to the device regions.

2. The method of claim 1, wherein the scribe lane region of the crystalline semiconductor layer comprises:
    a first region overlapped by the partition structure, when viewed in a plan view; and
    a second region spaced apart from the partition structure, when viewed in the plan view, the second region disposed between the first region and one of the device regions,
    wherein the amorphous region is formed in the first region of the scribe lane region.

3. The method of claim 2, wherein the first region of the scribe lane region has a width of 5 µm to 20 µm.

4. The method of claim 1, the method further comprising:
    forming the partition structure in the dielectric layer and in physical contact with the protective layer.

5. The method of claim 1, wherein the protective layer has a shear strength greater than that of the dielectric layer.

6. The method of claim 1, wherein the partition structure extends into the protective layer.

7. The method of claim 1, further comprising forming a trench in the dielectric layer, and
    filling the trench with the partition structure.

8. The method of claim 7, wherein the partition structure is connected to the protective layer and includes the same material as the protective layer.

9. The method of claim 1, wherein the partition structure extends into the crystalline semiconductor layer.

10. The method of claim 1, wherein forming the amorphous region comprises irradiating the crystalline semiconductor layer with a laser.

11. The method of claim 1, wherein the dielectric layer includes a low-k dielectric material.

12. The method of claim 1, wherein the partition structure includes a plurality of partition structures provided on the scribe lane region disposed between the device regions.

13. A method of dividing a substrate, the method comprising:
    preparing a substrate; the substrate comprising
        a crystalline semiconductor layer having a scribe lane region and device regions, the device regions separated from one another by the scribe lane region;
        a dielectric layer on the crystalline semiconductor layer;
        a partition structure in physical contact with the dielectric layer, the partition structure provided on the scribe lane region of the crystalline semiconductor layer; and
        a protective layer on an uppermost surface of the partition structure and an upper surface of the dielectric layer, wherein the protective layer overlaps the scribe lane region and extends to the device regions,
    forming an amorphous region in the crystalline semiconductor layer; and
    performing a grinding process on the crystalline semiconductor layer after forming the amorphous region,
    wherein the amorphous region is formed in the scribe lane region of the crystalline semiconductor layer, and
    wherein the protective layer comprises a material different from that of the dielectric layer.

14. The method of claim 13, wherein the protective layer includes an insulating material.

15. The method of claim 13, wherein the partition structure is disposed in the dielectric layer.

* * * * *